(12) United States Patent
Fujimura (10) Patent No.: US 9,913,373 B2
(45) Date of Patent: Mar. 6, 2018

(54) SUSPENSION BOARD WITH CIRCUIT AND PRODUCING METHOD THEREOF

(71) Applicant: NITTO DENKO CORPORATION, Osaka (JP)

(72) Inventor: Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/368,862

(22) Filed: Dec. 5, 2016

(65) Prior Publication Data

US 2017/0164470 A1    Jun. 8, 2017

(30) Foreign Application Priority Data

Dec. 7, 2015  (JP) ................. 2015-238853

(51) Int. Cl.
| | |
|---|---|
| *H05K 1/03* | (2006.01) |
| *H05K 1/05* | (2006.01) |
| *G11B 5/48* | (2006.01) |
| *H05K 1/11* | (2006.01) |
| *H05K 1/18* | (2006.01) |
| *H05K 3/00* | (2006.01) |

(52) U.S. Cl.
CPC ............. *H05K 1/056* (2013.01); *G11B 5/483* (2015.09); *G11B 5/4853* (2013.01); *H05K 1/0313* (2013.01); *H05K 1/111* (2013.01); *H05K 1/181* (2013.01); *H05K 3/0023* (2013.01); *H05K 2201/10083* (2013.01)

(58) Field of Classification Search
CPC ........ H05K 1/056; H05K 1/0313; H05K 1/111; H05K 1/181; G11B 5/483
USPC .................. 174/255, 250, 251, 256–262
See application file for complete search history.

(56) References Cited

U.S. PATENT DOCUMENTS

2012/0193127 A1\*  8/2012  Ishigaki ............... G11B 5/4846
                                                                    174/251
2015/0187377 A1    7/2015  Fujimura

FOREIGN PATENT DOCUMENTS

JP         2015-125793 A      7/2015

\* cited by examiner

*Primary Examiner* — Tremesha S Willis
(74) *Attorney, Agent, or Firm* — Edwards Neils LLC; Jean C. Edwards, Esq.

(57) ABSTRACT

A suspension board with circuit includes a metal supporting board, a conductor layer having a terminal capable of being electrically connected to the piezoelectric element and disposed above the metal supporting board at spaced intervals thereto, a first insulating layer disposed between the metal supporting board and the conductor layer so as to support the conductor layer, and a second insulating layer disposed on the first insulating layer and the conductor layer so as to expose the terminal. The first insulating layer includes a first portion including the terminal viewed from a thickness direction of the metal supporting board and a second portion disposed in a position different from that of the first portion viewed from the thickness direction. The thickness of the first portion is thinner than that of the second portion.

6 Claims, 7 Drawing Sheets

Rear side ←——→ Front side

SUSPENSION BOARD WITH CIRCUIT AND PRODUCING METHOD THEREOF

CROSS-REFERENCE TO RELATED APPLICATION

The present application claims priority from Japanese Patent Application No. 2015-238853 filed on Dec. 7, 2015, the contents of which are hereby incorporated by reference into this application.

BACKGROUND OF THE INVENTION

Field of the Invention

The present invention relates to a suspension board with circuit and a producing method thereof.
Description of Related Art As a suspension board with circuit to be mounted on a hard disk drive, a suspension board with circuit on which a slider having a magnetic head is capable of being mounted has been conventionally known.

As such a suspension board with circuit, for example a suspension board with circuit mounted with a piezoelectric element so as to precisely and finely adjust the position and angle of the magnetic head has been proposed (ref: for example, Japanese Unexamined Patent Publication No. 2015-125793).

SUMMARY OF THE INVENTION

In the above-described suspension board with circuit described in Japanese Unexamined Patent Publication No. 2015-125793, it has been considered that the piezoelectric element is more surely connected to the suspension board with circuit.

It is an object of the present invention to provide a suspension board with circuit that is capable of surely connecting a piezoelectric element to a terminal, and a producing method thereof.

The present invention [1] includes a suspension board with circuit capable of being mounted with a piezoelectric element including a metal supporting board, a conductor layer having a terminal capable of being electrically connected to the piezoelectric element and disposed above the metal supporting board at spaced intervals thereto, a first insulating layer disposed between the metal supporting board and the conductor layer so as to support the conductor layer, and a second insulating layer disposed on the first insulating layer and the conductor layer so as to expose the terminal, wherein the first insulating layer includes a first portion including the terminal viewed from a thickness direction of the metal supporting board and a second portion disposed in a position different from that of the first portion viewed from the thickness direction, and the thickness of the first portion is thinner than that of the second portion.

According to the structure, in the first insulating layer, by forming the first portion in which the terminal capable of being electrically connected to the piezoelectric element is formed thinner than another portion (second portion), a distance between the piezoelectric element and the metal supporting board in the thickness direction can be adjusted.

Also, by thinly forming the first insulating layer, an interval between the terminal and the piezoelectric element can be ensured, and a bonding material can sufficiently fill a space between the terminal and the piezoelectric element.

As a result, the piezoelectric element can be surely connected to the terminal.

The present invention [2] includes the suspension board with circuit described in the above-described [1], wherein the area of the first portion is larger than that of the terminal viewed from the thickness direction.

According to the structure, the piezoelectric element can be surely connected to the terminal on the first portion.

The present invention [3] includes the suspension board circuit described in the above-described [2], wherein the second insulating layer includes a third portion disposed on the first portion and a fourth portion disposed on the second portion, and the thickness of the third portion is the same as that of the fourth portion.

According to the structure, an interval between the terminal and the piezoelectric element can be ensured with an easy structure by the thickness of the third portion.

The present invention [4] includes a method for producing a suspension board with circuit of an one of the above-described [1] to [3] including the steps of forming the first insulating layer on the metal supporting board, forming the conductor layer on the first insulating layer, and forming the second insulating layer on the first insulating layer and the conductor layer so as to expose the terminal, wherein the first portion and the second portion are formed in the first insulating layer by subjecting a varnish of a photosensitive resin applied in a uniform thickness to gradation exposure to light.

According to the method, the thickness of the first portion can be efficiently adjusted by using the step of forming the first insulating layer without separately adding a step.

Therefore according to the method for producing a suspension board with circuit of the present invention, the above-described suspension board with circuit can be efficiently produced.

BRIEF DESCRIPTION OF THE DRAWINGS

FIGS. 3A to 3E show process drawings for illustrating a method for producing the first embodiment of the suspension board with circuit;

FIG. 3A illustrating a step of preparing a metal supporting board,

FIG. 3B illustrating a step of forming a film of a photosensitive resin on the metal supporting board and subjecting the film to gradation exposure to light, FIG. 3C illustrating a step of developing the film subjected to gradation exposure to light and forming a base insulating layer, FIG. 3D illustrating a step of forming a conductor pattern on the base insulating layer, and FIG. 3E illustrating a step of forming a cover insulating layer.

FIGS. 6A to 6D show process drawings for illustrating a method for producing the second embodiment of the suspension board with circuit;

FIG. 6A illustrating a step of preparing a metal supporting board,

FIG. 6B illustrating a step of forming a base insulating layer on the metal supporting board, FIG. 6C illustrating a step of forming a first conductor pattern on the base insulating layer, and FIG. 6D illustrating a step of forming a film of a photosensitive resin on the metal supporting board, the base insulating layer, and the first conductor pattern, and subjecting the film to gradation exposure to light.

FIGS. 7E to 7G, subsequent to FIG. 6D, show process drawings for illustrating a method for producing the second embodiment of the suspension board with circuit;

FIG. 7E illustrating a step of developing the film subjected to gradation exposure to light and forming an intermediate insulating layer, FIG. 7F illustrating a step of forming a second conductor pattern on the intermediate insulating layer, and FIG. 7G illustrating a step of forming a cover insulating layer.

DETAILED DESCRIPTION OF THE INVENTION

First Embodiment

A first embodiment of a suspension board with circuit 1 is described with reference to FIGS. 1 to 3E.

Figure 1:
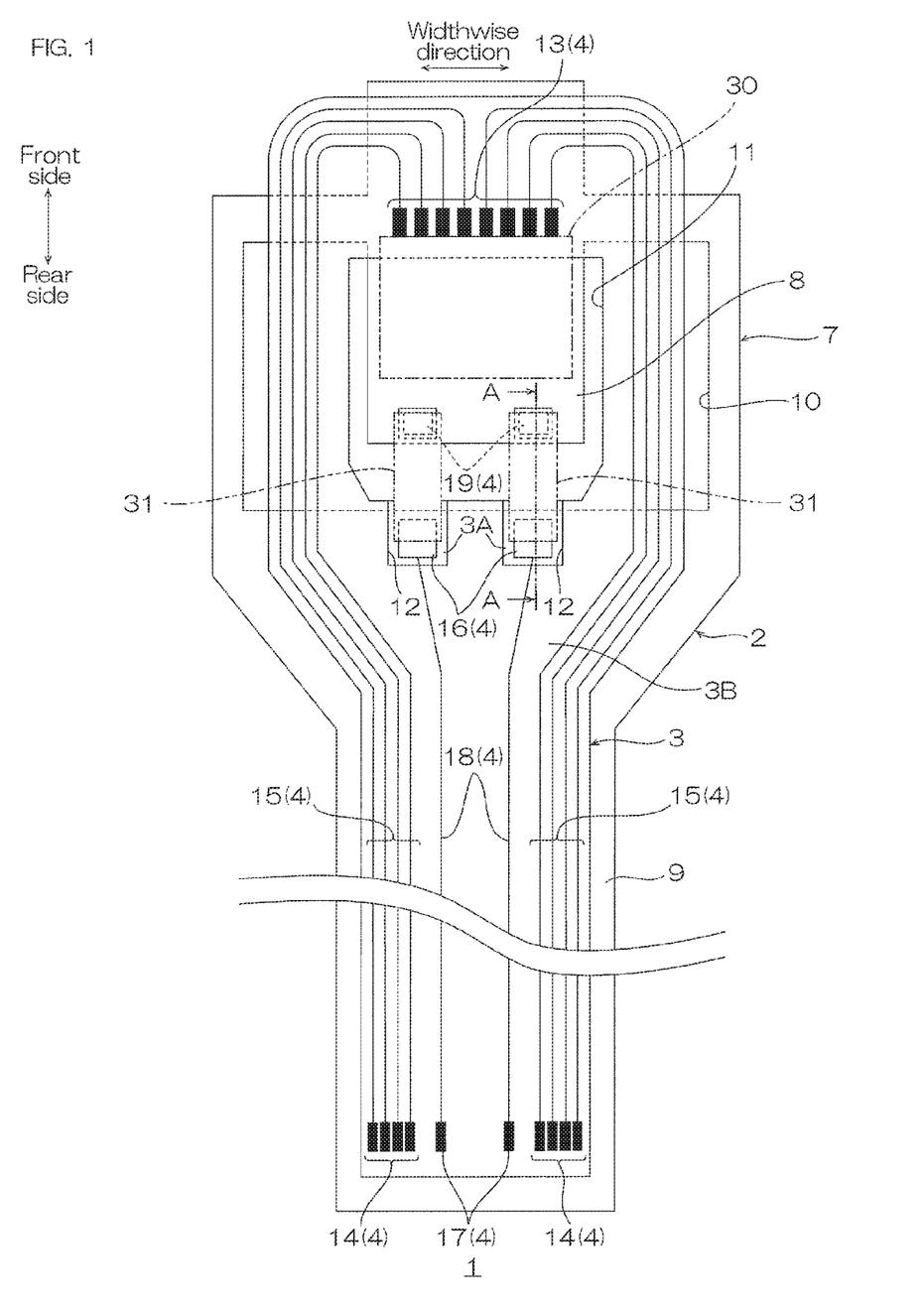
FIG. 1 shows a plan view of a first embodiment of a suspension board with circuit of the present invention.

As shown in FIG. 1, the suspension board with circuit 1 has a flat belt shape extending in an up-down direction of the paper surface. As shown by phantom lines in FIG. 1, the suspension board with circuit 1 is capable of being mounted with a slider 30 and piezoelectric elements 31.

In the following description, a side where magnetic head-connecting terminals 13 to be described later are disposed is defined as the front side of the suspension board with circuit 1 and a side where external connecting terminals 14 to be described later are disposed is defined as the rear side thereof. A direction orthogonal to both a direction connecting the front side to the rear side (front-rear direction and a thickness direction of a metal supporting board 2 to be described later is a widthwise direction of the suspension board with circuit 1.

Figure 2:
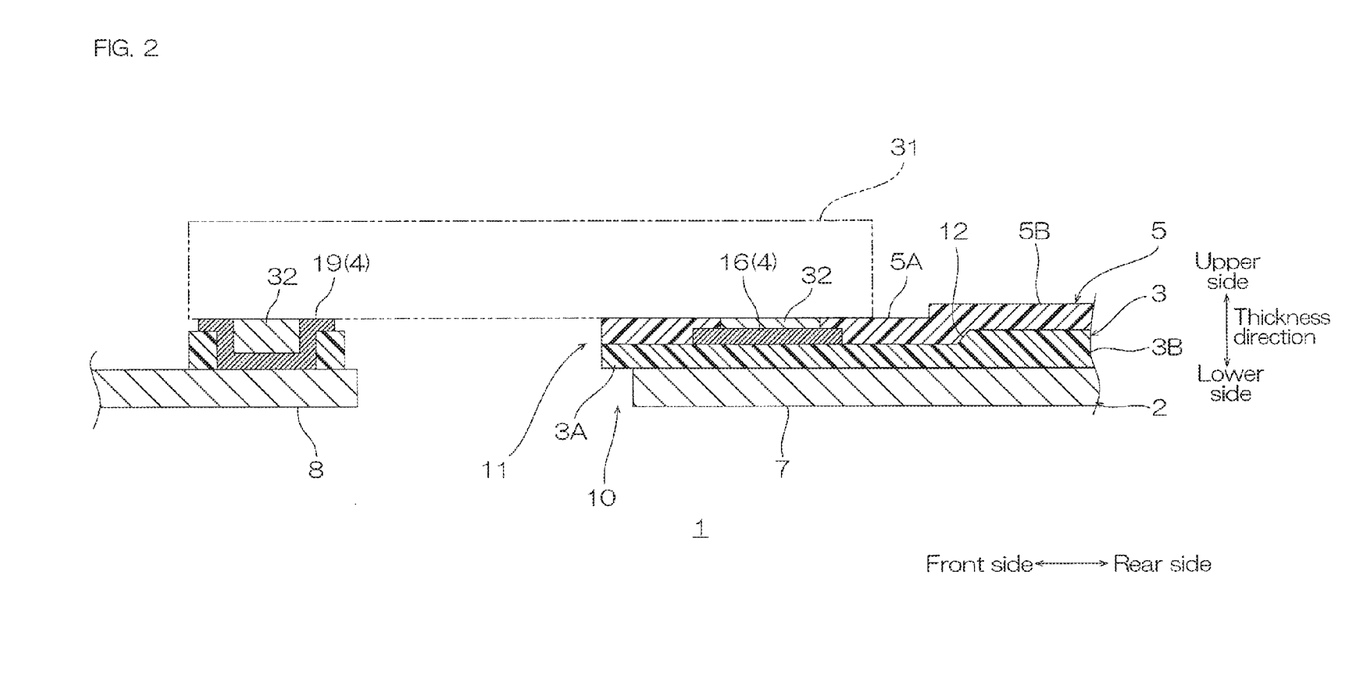
FIG. 2 shows an A-A sectional view of the suspension board with circuit shown in FIG. 1.

As shown in FIGS. 1 and 2, the suspension board with circuit 1 includes the metal supporting board 2, a base insulating layer 3 as core example of the first insulating layer, a conductor pattern 4 as one example of the conductor layer, and a cover insulating layer 5 as one example of the second insulating layer. In FIG. 1, the cover insulating layer 5 is omitted in order to clearly show the structure of the conductor pattern 4.

The metal supporting board 2 integrally includes a frame portion 7, a supporting portion 8, and a wired portion 9.

The frame portion 7 is disposed at the front end portion of the metal supporting board 2. The frame portion 7 has a frame shape in a generally rectangular shape in plan view with the rear end portion thereof narrowed down.

The supporting portion 8 is disposed at the inner side of the frame portion 7. The supporting portion 8 has a flat plate shape in a generally rectangular shape in plan view. The front end portion of the supporting portion 8 is continuous to the inner circumferential edge of the front side of the frame portion 7. The rear end portion thereof is spaced apart from the inner circumferential edge of the rear side of the frame portion 7. The end portions in the widthwise direction of the supporting portion 8 are spaced apart from the inner circumferential edges in the widthwise direction of the frame portion 7. That is, an opening 10 in a generally U-shape in plan view having an opening toward the front side is formed between the supporting portion 8 and the frame portion 7.

The wired portion 9 extends from the rear end portion of the frame portion 7 continuously rearward. The wired portion 9 has a flat belt shape.

The base insulating layer 3 is disposed on the metal supporting board 2. The base insulating layer 3 has a flat belt shape extending in the front-rear direction. An opening 11 and a plurality (two pieces) of recessed portions 12 are feinted in the base insulating layer 3.

The opening 11 is disposed at the central portion in the widthwise direction at the front end portion of the base insulating layer 3. The opening 11 has a generally rectangular shape in an view. The opening 11 passes through the base insulating layer 3 in the thickness direction. The opening 11 exposes the supporting portion 8 of the metal supporting board 2. The rear-side circumferential edge portion of the opening 11 is disposed at the rear side with respect to the rear end edge of the supporting portion 8. The rear-side circumferential edge portion of the opening 11 is spaced apart from the rear end edge of the supporting portion 8.

The plurality of recessed portions 12 are disposed at the rear side of the opening 11. The plurality of recessed portions 12 are disposed in parallel at spaced intervals to each other in the widthwise direction. The recessed portion 12 has a generally rectangular shape in plan view, that is, viewed from the thickness direction of the metal supporting board 2. The recessed portions 12 are dented from the upper surface of the base insulating layer 3 toward the metal supporting board 2. Portions where the recessed portions 12 are formed are defined as first portions 3A of the base insulating layer 3. A portion other than the portions where the recessed portions 12 are formed is defined as a second portion 3B of the base insulating layer 3. That is, the second portion 3B is, in plan view, disposed in a position different from that of the first portions 3A. In the base insulating layer 3, the thickness of the first portions 3A is thinner than that of the second portion 3B.

The conductor pattern 4 is formed on the upper surface of the base insulating layer 3. That is, the conductor pattern 4 is disposed above the metal supporting board 2 at spaced intervals thereto and supported by the base insulating layer 3. In other words, the base insulating layer 3 is disposed between the metal supporting board 2 and the conductor pattern 4. The conductor pattern 4 includes the plurality (eight pieces) of magnetic head-connecting terminals 13, the plurality (eight pieces) of external connecting terminals 14, a plurality (eight pieces) of first wires 15, a plurality (two pieces) of piezoelectric element-connecting terminals 16 as one example of the terminal, a plurality (two pieces) of power source terminals 17, a plurality (two pieces) of second wires 18, and a plurality (two pieces) of ground terminals 19.

The plurality of magnetic head-connecting terminals 13 are disposed at the front side of the opening 11 in the base insulating layer 3. The plurality of magnetic head-connecting terminals 13 are disposed in parallel at spaced intervals to each other in the widthwise direction. The magnetic head-connecting terminal 13 has a generally rectangular shape (square land shape) in plan view.

The plurality of external connecting terminals 14 are disposed at the rear end portion of the base insulating layer 3 on the wired portion 9. The plurality of external connecting terminals 14 are disposed in parallel at spaced intervals to each other in the widthwise direction. The external connecting terminal 14 has a generally rectangular shape (square land shape) in plan view. The external connecting terminals 14 are to be connected to an external control board (not shown) or the like. The shapes, arrangement, and connecting method thereof can be arbitrarily selected in accordance with the structure of the external control board (not shown).

The plurality of first wires 15 are disposed at spaced intervals to each other over the frame portion 7 and the wired portion 9. The first wires 15 pass the outer side in the widthwise direction of the opening 11 from the front end portions of the respective magnetic head-connecting terminals 13 to be continuous to the respective external connecting terminals 14.

The piezoelectric element-connecting terminals 16 are, in plan view, disposed at the inner sides of the recessed portions 12. The piezoelectric element-connecting terminals 16 are formed on the upper surfaces of the first portions 3A. The piezoelectric element-connecting terminal 16 has a generally rectangular shape (square land shape) in plan view. The area of the piezoelectric element-connecting terminal 16 is, in plan view, smaller than that of the first portion 3A. That is, the piezoelectric element-connecting terminal 16 is, in plan view, included in the first portion 3A.

The plurality of power source terminals 17 are disposed at the inner side in the widthwise direction with respect to all of the external connecting terminals 14 at the rear end portion of the base insulating layer 3 on the wired portion 9. The plurality of power source terminals 17 are disposed in parallel at spaced intervals to each other in the widthwise direction. The power source terminal 17 has a generally rectangular shape (square land shape) in plan view. The power source terminals 17 are to be connected to an external wired circuit board (not shown) or the like. The shapes, arrangement, and connecting method thereof can be arbitrarily selected in accordance with the structure of the external wired circuit board (not shown).

The plurality of second wires 18 are disposed at spaced intervals to each other over the frame portion 7 and the wired portion 9. The second wires 18 are continuous to the respective piezoelectric element-connecting terminals 16 and the respective power source terminals 17.

The plurality of ground terminals 19 are disposed at the rear end portion of the supporting portion 8 of the metal supporting board 2. The plurality of ground terminals 19 are disposed in parallel at spaced intervals to each other in the widthwise direction. The ground terminal 19 has a generally rectangular shape (square land shape) in plan view. The ground terminals 19 are in contact with the upper surface of the supporting portion 8. The ground terminals 19 are electrically connected to the supporting portion 8.

The cover insulating layer 5 is disposed on the base insulating layer 3 and the conductor pattern 4. The cover insulating layer 5 exposes the magnetic head-connecting terminals 13, the external connecting terminals 14, the piezoelectric element-connecting terminals 16, and the power source terminals 17, and covers the first wires 15 and the second wires 18. The cover insulating layer 5 is formed in a uniform thickness. That is, in the cover insulating layer 5, the thickness of portions (third portions 5A) disposed on the first portions 3A of the base insulating layer 3 is the same as that of a portion (fourth portion 5B) disposed on the second portion 3B of the base insulating layer 3.

Next, a method for producing the suspension board with circuit 1 is described with reference to FIGS. 3A to 3E.

Figure 3A:
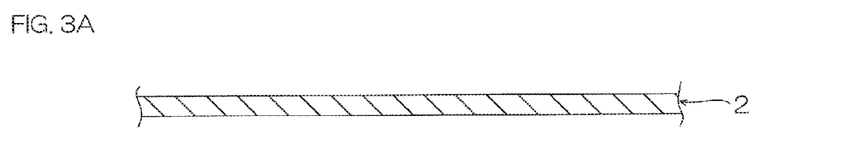

As shown in FIG. 3A, in order to produce the suspension board with circuit. 1, first, the metal supporting board 2 is prepared.

An example of the material that forms the metal supporting board 2 includes a metal material such as stainless steel, 42-alloy, aluminum, cooper-beryllium and phosphor bronze. Preferably, stainless steel is used.

The supporting board 2 has a thickness of, for example, 15 µm or more and, for example, 50 µm or less, or preferably 30 µm or less.

Figure 3B:
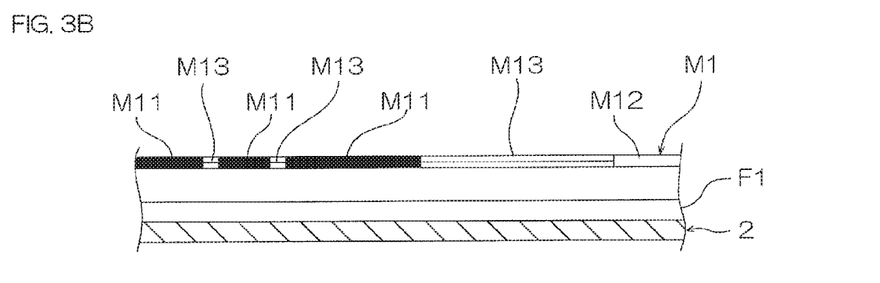

Next, as shown in FIG. 3B, a varnish of a photosensitive resin is applied to the upper surface of the metal supporting board 2 in a uniform thickness to be then dried. In this manner, a film F1 of the photosensitive resin having a uniform thickness is formed on the upper surface of the metal supporting board 2.

An example of the photosensitive resin includes a synthetic resin such as polyimide resin, polyamide imide resin acrylic resin, polyether nitrile resin, polyether sulfone resin, polyethylene terephthalate resin, polyethylene naphthalate resin, and polyvinyl chloride resin. Preferably, polyimide resin is used.

Next, a photomask M1 is disposed at the upper side of the film F1 and the film F1 is subjected to gradation exposure to light via the photomask M1.

The photomask M1 includes a gradation pattern consisting of a light shielding portion M11, a light fully transmitting portion M12, and a light semi-transmitting portion M13.

The light shielding portion M11 faces a portion where the base insulating layer is not formed. The light shielding portion M11 shields the light to the film F1.

The light fully transmitting portion M12 faces a portion where the second portion 3B of the base insulating layer 3 is formed. The light fully transmitting portion M12 transmits the light to the film F1.

The light semi-transmitting portion M13 faces a portion where the first portions 3A of the base insulating layer 3 are formed. The light semi-transmitting portion M13 transmits the light to the film F1, while decreasing the intensity of the lower than that of the light transmitted from the light fully transmitting portion M12.

Next, the film F1 is developed.

Then, of the film F1, the portion thereof facing the light shielding portion M11 is dissolved by a developing solution and then, removed. Of the film F1, the portion thereof facing the light fully transmitting portion M12 is not dissolved by a developing solution and remains. Of the film F1, the portion thereof facing the light semi-transmitting portion M13 is partially dissolved by a developing solution and remains in a thinner thickness than that of the portion facing the light fully transmitting portion M12.

Thereafter, the film F1 is cured by heating as needed.

Figure 3C:
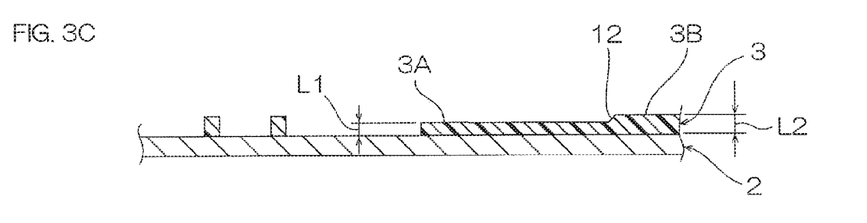

In this manner, as shown in FIG. 3C, as described above, the base insulating layer 3 is formed on the upper surface of the metal supporting board 2 in a pattern having the first portions 3A and the second portion 3B.

The first portion 3A of the base insulating layer 3 has a thickness L1 of, for example, 1 µm or more, or preferably 3 µm or more and, for example, 15 µm or less, or preferably 10 µm or less.

The second portion 3B of the base insulating layer 3 has a thickness L2 of, for example, 3 µm or more, or preferably 5 µm or more and, for example, 35 µm or less, or preferably 15 µm or less.

When the thickness L2 of the second portion 3B is 100%, the thickness L1 of the first portion 3A is, for example, 10% or more, or preferably 30% or more and, for example, 95% or less, or preferably 80% or less.

Figure 3D:
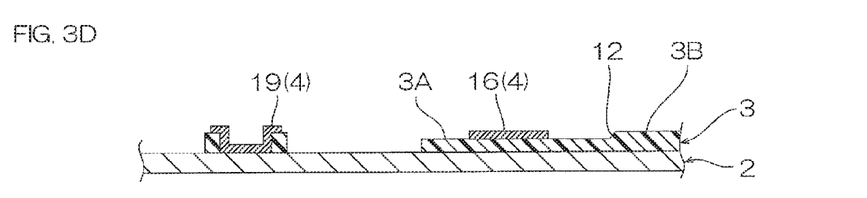

Next, as shown in FIG. 3D, the conductor pattern 4 is formed on the upper surface of the base insulating layer 3 by an additive method, a subtractive method, or the like.

An example of the material that forms the conductor pattern 4 includes a conductor material such as copper, nickel, gold, solder, or an alloy thereof. Preferably, copper is used.

The conductor pattern 4 has a thickness of, for example, 3 μm or more, or preferably 5 μm or more and, for example, 50 μm or less, or preferably 20 μm or less.

The first wire 15 and the second wire 18 have a width of, for example, 5 μm or more, or preferably 8 μm or more and, for example, 200 μm or less, or preferably 100 μm or less.

An interval in the widthwise direction between the first wires 15 is, for example, 5 μm or more, or preferably 8 μm or more and, for example, 1000 μm or less, or preferably 100 μm or less.

An interval in the widthwise direction between the first wire 15 and the second wire 18 is, for example, 5 μm or more, or preferably 8 μm or more and, for example, 1000 μm or less, or preferably 100 μm or less.

The magnetic head-connecting terminal 13 has a width of, for example, 15 μm or more, or preferably 20 μm or more and, for example, 1000 μm or less, or preferably 800 μm or less.

An interval between the magnetic head-connecting terminals 13 is, for example, 15 μm or more, or preferably 20 μm or more and, for example, 1000 μm or less, or preferably 800 μm or less.

The external connecting terminal 14 has a width of, for example, 15 μm or more, or preferably 20 μm or more and, for example, 1000 μm or less, or preferably 800 μm or less.

An interval between the external connecting terminals 14 is, for example, 15 μm or more, or preferably 20 μm or more and, for example, 1000 μm or less, or preferably 800 μm or less.

An interval between the external connecting terminal 14 and the power source terminal 17 is, for example, 5 μm or more, or preferably 8 μm or more and, for example, 1000 μm or less, or preferably 100 μm or less.

The piezoelectric element-connecting terminal 16 has a width of, for example, 15 μm or more, or preferably 20 μm or more and, for example, 1000 μm or less, or preferably 800 μm or less.

An interval between the piezoelectric element-connecting terminals 16 is, for example, 15 μm or more, or preferably 20 μm or more and, for example, 1000 μm or less, or preferably 800 μm or less.

The ground terminal 19 has a width of, for example, 15 μm or more, or preferably 20 μm or more and, for example, 1000 μm or less, or preferably 800 μm or less.

An interval between the ground terminals 19 is, for example, 15 μm or more, or preferably 20 μm or more and, for example, 1000 μm or less, or preferably 800 μm or less.

Figure 3E:
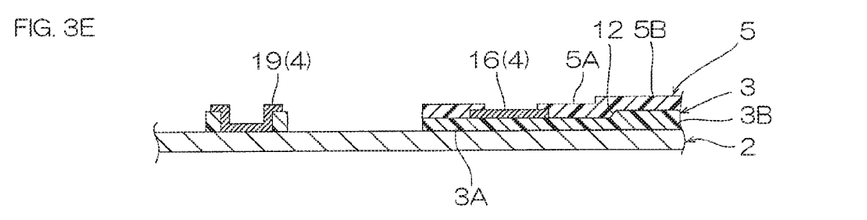

Next, a varnish of a photosensitive resin is applied onto the base insulating layer 3 so as to cover the conductor pattern 4 to be then dried. Thereafter, the obtained film is exposed to light and developed to be then cured by heating. At this time, the obtained film is not subjected to gradation exposure to light. That is, by using a photomask having a pattern consisting of only the light shielding portion and the light fully transmitting portion, the light shielding portion faces the portion where the cover insulating layer 5 is not formed and the light fully transmitting portion faces the portion where the cover insulating layer 5 is formed to be then exposed to light.

In this manner, as shown FIG. 3E, the cover insulating layer 5 is formed in the above-described pattern.

An example of the material that forms the cover insulating layer 5 includes the same photosensitive resin as that of the above-described base insulating layer 3.

The cover insulating layer 5 has a thickness of, for example, 1 μm or more and, for example, 40 μm or less, or preferably 10 μm or less.

Thereafter, the metal supporting board 2 is processed into the above-described outer shape. At this time, as shown in FIG. 2, the opening 10 is formed.

To process the metal supporting board 2, for example, an etching method such as dry etching (for example, plasma etching) or wet etching (for example, chemical etching); drilling; or laser processing is used. Preferably, an etching method is used.

In this manner, the suspension board with circuit 1 is completed.

Next, the mounting of the slider 30 and the piezoelectric elements 31 with respect to the suspension board with circuit 1 is described with reference to FIGS. 1 and 2.

As shown in FIG. 1, the slider 30 is fixed to the supporting portion 8 of the metal supporting board 2 by an adhesive or the like. The slider 30 has a magnetic head that is not shown at the front end portion thereof. The magnetic head-connecting terminals 13 are connected to terminals of the magnetic head that is not shown of the slider 30 via a bonding material such as solder and electrically connected thereto.

As shown in FIGS. 1 and 2, the piezoelectric element 31 has a generally rectangular shape in plan view extending in the front-rear direction. The front end portions of the piezoelectric elements 31 are connected to the ground terminals 19 via a bonding material 32 such as sliver paste and low melting point solder. The rear end portions thereof are connected to the piezoelectric element-connecting terminals 16 via the bonding material 32 such as silver paste and low melting point solder. By supplying electric power to the piezoelectric elements 31 via the power source terminals 17 and the second wires 18 and controlling its voltage, the piezoelectric elements 31 extend and contract in the front-rear direction. The position of the slider 30 can be precisely and finely adjusted by extending and contracting of the piezoelectric elements 31.

According to the suspension board with circuit 1, as shown in FIG. 2, in the base insulating layer 3, by forming the first portions 3A where the piezoelectric element-connecting terminals 16 are formed thinner than another portion (second portion 3B), a distance between the piezoelectric elements 31 and the metal supporting board 2 in the thickness direction can be adjusted.

When the distance between the piezoelectric elements 31 and the metal supporting board 2 in the thickness direction is adjusted, it is considered that the cover insulating layer 5 is formed thin. However, when the cover insulating layer 5 is formed thin and the piezoelectric elements 31 are placed on the portion where the cover insulating layer 5 is formed thin, an interval between the piezoelectric element-connecting terminals 16 and the piezoelectric elements 31 may be narrow and it may be difficult to ensure the amount of the bonding material 32.

In this regard, according to the suspension board with circuit 1, the base insulating layer 3 is formed thin.

Thus, compared to the case where the cover insulating layer 5 is formed thin, an interval between the piezoelectric element-connecting terminals 16 and the piezoelectric elements 31 can be ensured. Also, the bonding material 32 can sufficiently fill a space between the piezoelectric element-connecting terminals 16 and the piezoelectric elements 31.

As a result, the piezoelectric elements 31 can be surely connected to the piezoelectric element-connecting terminals 16.

According to the suspension board with circuit 1, as shown in FIG. 1, the area of the first portion 3A is larger than that of the piezoelectric element-connecting terminal 16 viewed from the thickness direction.

Thus, the piezoelectric elements 31 can be surely connected to the piezoelectric element-connecting terminals 16 on the first portions 3A. 2 in the cover according to the suspension board with circuit 1, as shown 1

According to the suspension board with circuit 1, as shown in FIG. 2, in the cover insulating layer 5, the thickness of the third portions 5A disposed on the first portions 3A of the base insulating layer 3 is the same as that of the fourth portion 5B disposed on the second portion 3B of the base insulating layer 3.

Thus, the interval between the piezoelectric element-connecting terminals 16 and the piezoelectric elements 31 can be ensured with an easy structure by the thickness of the third portions 5A, while the first portions 3A where the piezoelectric element-connecting terminals 16 are formed are formed thin in the base insulating layer 3, and the distance between the piezoelectric elements 31 and the metal supporting board 2 in the thickness direction can be adjusted.

As a result, the piezoelectric elements 31 can be more surely connected to the piezoelectric element-connecting terminals 16.

According to the method for producing the suspension board with circuit 1, as shown in FIGS. 3B and 3C, the first portions 3A and the second portion 3B are formed in the base insulating layer 3 by subjecting a varnish of photosensitive resin applied in a uniform thickness to gradation exposure to light.

Thus, the thickness of the first portions 3A can be efficiently adjusted by using the step of forming the base insulating layer 3 without separately adding a step.

Second Embodiment

Next, a second embodiment of a suspension board with circuit 40 is described with reference to FIGS. 4 to 7G. In the second embodiment, the same reference numerals are provided for members corresponding to each of those in the above-described first embodiment, and their detailed description is omitted.

In the above-described first embodiment, the first portions 3A having a thin thickness are formed in the base insulating layer 3 and the piezoelectric element-connecting terminals 16 are formed on the first portions 3A.

Figures 6A, 6B:
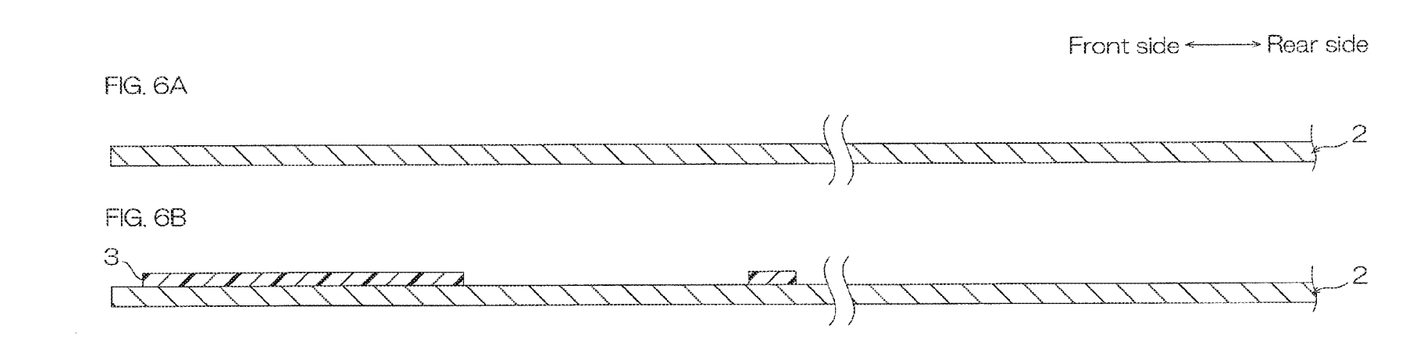
Figure 6C:
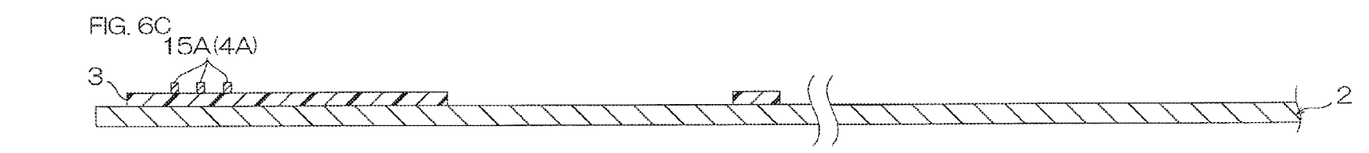
Figure 6D:
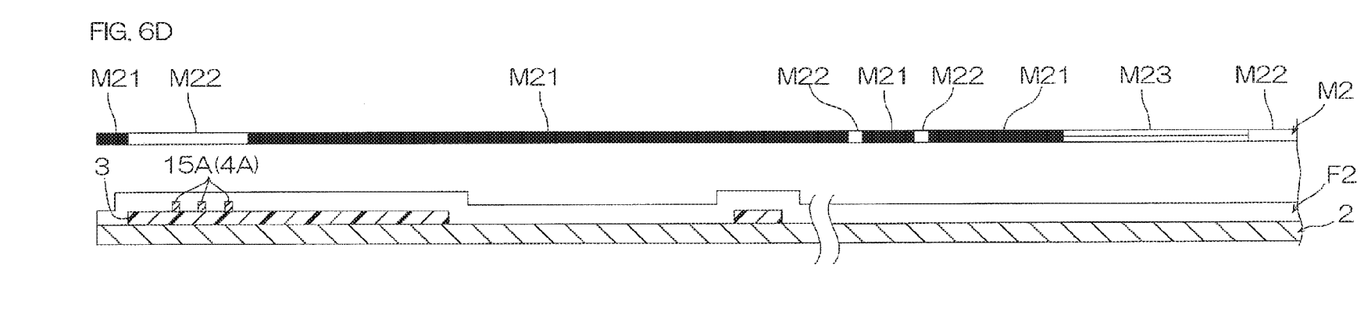
Figure 7E:
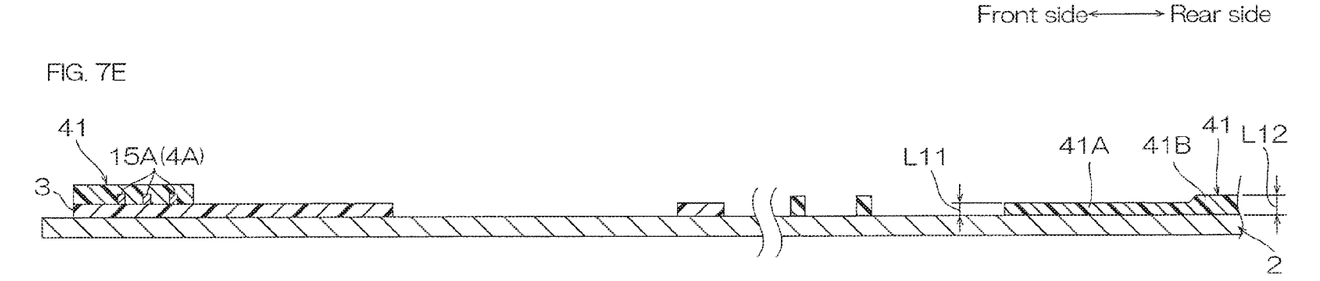

In contrast, in the second embodiment, as shown in FIGS. 6D and 7E, first portions 41A having a thin thickness are formed in an intermediate insulating layer 41 and the piezoelectric element-connecting terminals 16 are formed on the first portions 41A.

Figure 4:
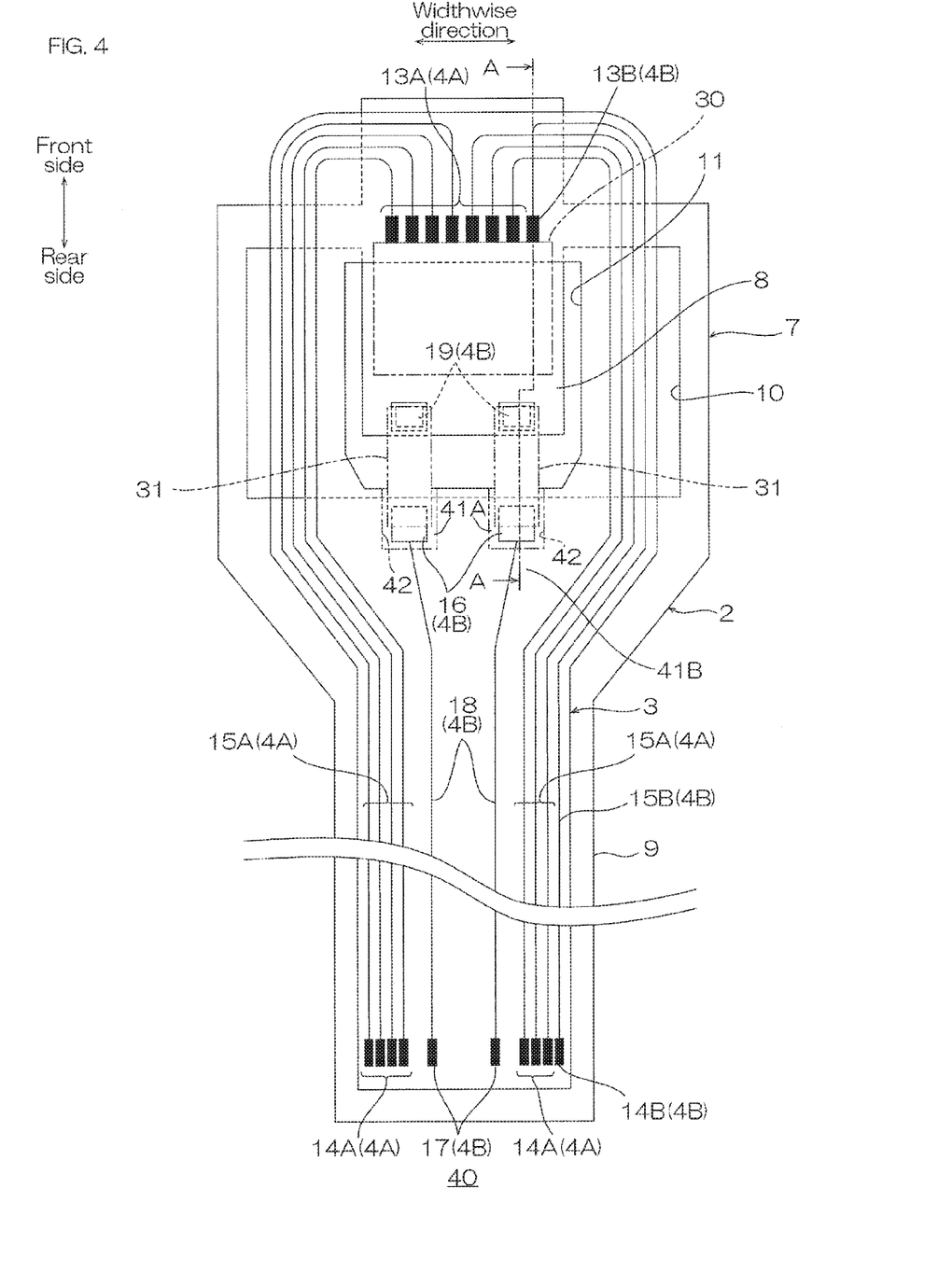
FIG. 4 shows a plan view of a second embodiment of a suspension board with circuit of the present invention.
Figure 5:
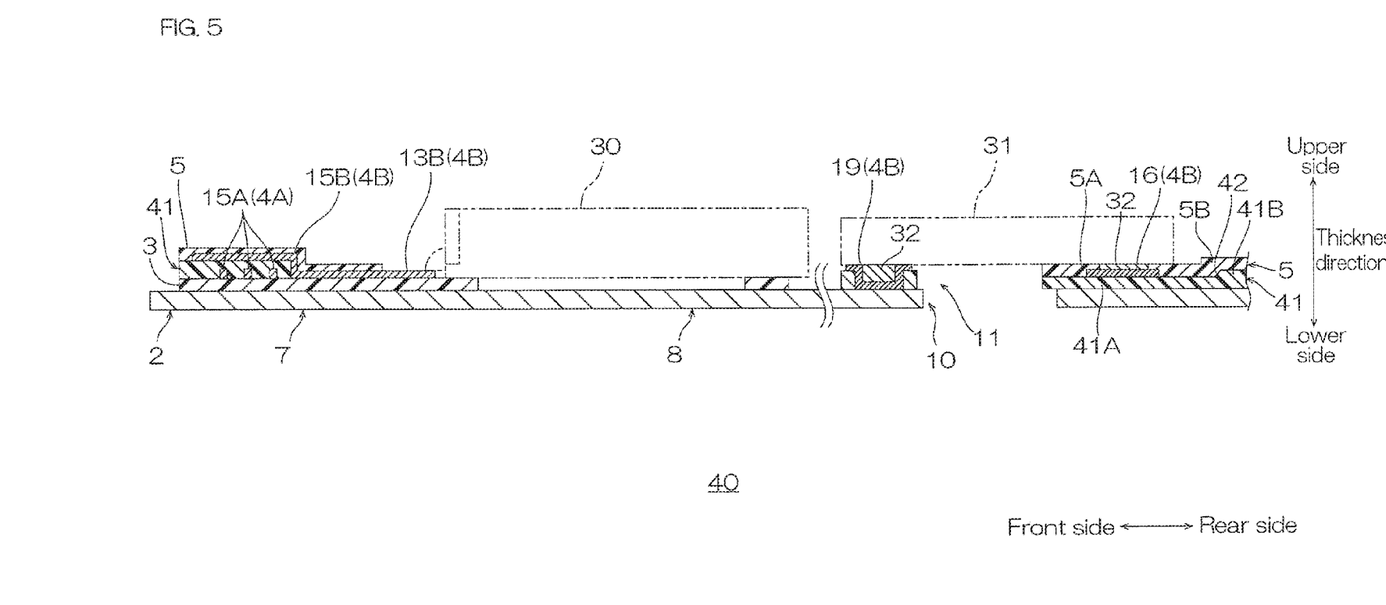
FIG. 5 shows A-A sectional view of the suspension board with circuit shown in FIG. 4.

As shown in FIGS. 4 and 5, the second embodiment of the suspension board with circuit 40 includes a first conductor pattern 4A and, as one example of the conductor layer, a second conductor pattern 4B instead of the conductor pattern 4 of the first embodiment. The suspension board with circuit 40 includes the intermediate insulating layer 41 as one example of the first insulating layer. That is, the second embodiment of the suspension board with circuit 40 includes the metal supporting board 2, the base insulating layer 3, the first conductor pattern 4A, the intermediate insulating layer 41, the second conductor pattern 4B, and the cover insulating layer 5. In FIG. 4, the intermediate insulating layer 41 and the cover insulating layer 5 are omitted in order to clearly show the structure of the first conductor pattern 4A and the second conductor pattern 4B.

The first conductor pattern 4A is formed on the surface of the base insulating layer 3. The first conductor pattern 4A includes a plurality (seven pieces) of magnetic head-connecting terminals 13A, a plurality (seven pieces) of external connecting terminals 14A, and a plurality (seven pieces) of first wires 15A.

The plurality of magnetic head-connecting terminals 13A are disposed in parallel at spaced intervals to each other in the widthwise direction in the same manner as the magnetic head-connecting terminals 13 of the first embodiment.

The plurality of external connecting terminals 14A are disposed in parallel at spaced intervals to each other in the widthwise direction in the same manner as the external connecting terminals 14 of the first embodiment.

The plurality of first wires 15A are disposed at spaced intervals to each other in the same manner as the first wires 15 of the first embodiment. The first wires 15A pass the outer side in the widthwise direction of the opening 11 from the front end portions of the respective magnetic head-connecting terminals 13A to be continuous to the respective external connecting terminals 14A.

The second conductor pattern 4B is formed on the upper surfaces of the base insulating layer 3 and the intermediate insulating layer 41. The second conductor pattern 4B includes one piece of magnetic head-connecting terminal 13B, one piece of external connecting terminal 14B, one piece of first wire 15B, the above-described piezoelectric element-connecting terminals 16, the above-described power source terminals 17, the above-described second wires 18, and the above-described ground terminals 19. The piezoelectric element-connecting terminals 16, the power source terminals 17, the second wires 18, and the ground terminals 19 are the same as those of the first embodiment except that they are formed on the intermediate insulating layer 41.

The magnetic head-connecting terminal 13B is formed on the upper surface of the base insulating layer 3. The magnetic head-connecting terminal 13B is disposed at spaced intervals to the plurality of magnetic head-connecting terminals 13A in the widthwise direction.

The external connecting terminal 14B is formed on the upper surface of the base insulating layer 3. The external connecting terminal 14B is disposed at spaced intervals to the plurality of external connecting terminals 14A in the widthwise direction.

The first wire 15B passes the outer side in the widthwise direction of the opening 11 from the front end portion of the magnetic head-connecting terminal 13B to be continuous to the external connecting terminal 14B. The first wire 15B crosses the first wires 15A of the first conductor pattern 4A at the front side of the magnetic head-connecting terminal 13B. At least in a portion where the first wire 15B crosses the first wires 15A of the first conductor pattern 4A, the first wire 15B is formed on the upper surface of the intermediate insulating layer 41. In a portion other than that, the first wire 15B is formed on the upper surface of the base insulating layer 3. The first wire 15B is disposed at spaced intervals to the plurality of first wires 15A the widthwise direction in the portion other than the portion where the first wire 15B crosses the first wires 15A of the first conductor pattern 4A.

The intermediate insulating layer 41 is provided at least in the portion where the first wires 15A of the first conductor pattern 4A cross the first wire 15B of the second conductor pattern 4B and below the piezoelectric element-connecting terminals 16, the power source terminals 17, the second wires 18, and the ground terminals 19. The base insulating layer 3 is not provided below the piezoelectric element-connecting terminals 16, the power source terminals 17, the second wires 18, and the ground terminals 19. In the portion, the intermediate insulating layer 41 is directly formed on the upper surface of the metal supporting board 2. The intermediate insulating layer 41 is disposed between the second conductor pattern 4B and the base insulating layer 3 in the portion where the first wires 15A of the fast conductor pattern 4A cross the first wire 15B of the second conductor pattern 4B. The intermediate insulating layer 41 covers the first wires 15A of the first conductor pattern 4A in the portion where the first wires 15A of the first conductor pattern 4A cross the first wire 15B of the second conductor pattern 4B.

The cover insulating layer 5 is formed on the upper surfaces of the base insulating layer 3, the intermediate insulating layer 41, the first wires 15A (portion that is not covered with the intermediate insulating layer 41) of the first conductor pattern 4A, the first wire 15B of the second conductor pattern 4B, and the second wires 18. That is, the cover insulating layer 5 is disposed on the intermediate insulating layer 41 and the second conductor pattern 4B. The cover insulating layer 5 covers the first wires 15A (portion that is not covered with the intermediate insulating layer 41) of the first conductor pattern 4A and the first wire 15B of the second conductor pattern 4B. The magnetic head-connecting terminals 13A the magnetic head-connecting terminal 13B, the external connecting terminals 14A, the external connecting terminal 14B, the piezoelectric element-connecting terminals 16, and the power source terminals 17 are exposed from the cover insulating layer 5.

In the second embodiment, a plurality of recessed portions 42 are formed in the intermediate insulating layer 41.

The recessed portions 42 are disposed in the same position as the recessed portions 12 of the first embodiment and have the same shapes as those of the recessed portions 12 of the first embodiment. The recessed portions 42 are dented from the upper surface of the intermediate insulating layer 41 toward the metal supporting board 2. Portions where the recessed portions 42 are formed are defined as the first portions 41A of the intermediate insulating layer 41. A portion other than the portions where the recessed portions 42 are formed is defined as a second portion 41B of the intermediate insulating layer 41. That is, the portion 41B is, in plan view, disposed in a position different from that of the first portions 41A. In the intermediate insulating layer 41, the thickness of the first portions 41A is thinner than that of the second portion 41B.

Next, a method for producing the suspension board with circuit 40 is described with reference to FIGS. 6A to 7G.

As shown in FIG. 6A, in order to produce the suspension board with circuit 40, first, the same metal supporting board 2 as that of the first embodiment is prepared.

Next, a varnish of a photosensitive resin is applied onto the metal supporting board 2 to be then dried. Thereafter, the obtained film is exposed to light and developed to be then cured by heating. In the second embodiment, at this time, the obtained film is not subjected to gradation exposure to light. That is, by using a photomask having a pattern consisting of only the light shielding portion and the light fully transmitting portion, the light shielding portion faces the portion where the base insulating layer 3 is not formed and the light fully transmitting portion faces the portion where the base insulating layer 3 is formed to be then exposed to light.

In this manner, as shown in FIG. 6B, the base insulating layer 3 is formed in the above-described pattern.

Next, as shown FIG. 6C, the first conductor pattern 4A is formed on the upper surface of the base insulating layer 3 by an additive method a subtractive method, or the like.

Next as shown in FIG. 6D, a varnish of a photosensitive resin is applied to the upper surfaces of the metal supporting board 2, the base insulating layer 3, and the first conductor pattern 4A in a uniform thickness to be then dried. In this manner, a film F2 of the photosensitive resin having a uniform thickness is formed on the upper surface of the metal supporting board 2.

Next, a photomask M2 is disposed at the upper side of the film F2 and the film F2 is subjected to gradation exposure to light via the photomask M2. The photomask M2 includes a gradation pattern consisting of a light shielding portion M21, a light fully transmitting portion M22, and a light semi-transmitting portion M23.

The light shielding portion M21 faces a portion where the intermediate insulating layer 41 is not formed. The light fully transmitting portion M22 faces a portion where the second portion 41B of the intermediate insulating layer 41 is formed. The light semi-transmitting portion M23 faces a portion where the first portions 41A of the intermediate insulating layer 41 are formed.

Next, the film F2 is developed and then, cured by heating as needed.

In this manner, as shown in FIG. 7E, the intermediate insulating layer 41 is formed on the upper surfaces of the metal supporting board 2, the base insulating layer 3, and the first conductor pattern 4A in the above-described pattern.

The first portion 41A of the intermediate insulating layer 41 has a thickness L11 of, for example, 1 μm or more, or preferably 3 μm or more and, for example, 15 μm or less, or preferably 10 μm or less.

The second portion 41B of the intermediate insulating layer 41 has a thickness L12 of, for example, 3 μm or more, or preferably 5 μm or more and, for example, 35 μm or less, or preferably 15 μm or less.

When the thickness L12 of the second portion 41B is 100%, the thickness L11 of the first portion 41A is, for example, 10% or more, or preferably 30% or more and, for example, 95% or less, or preferably 80% or less.

Figure 7F:
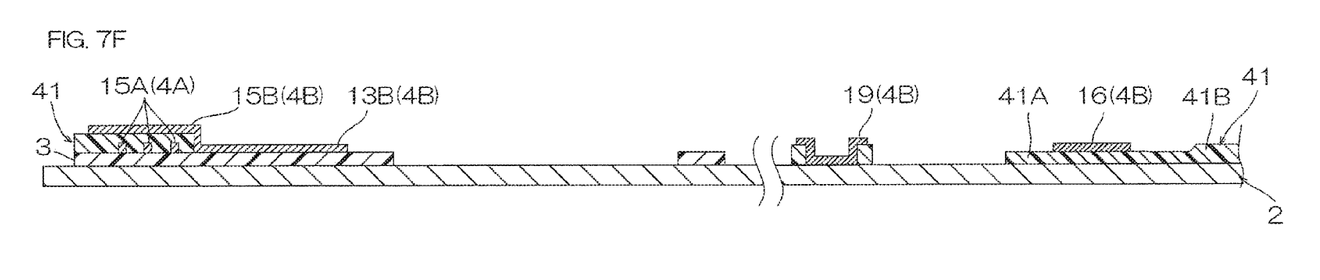

Next, as shown in FIG. 7, the second conductor pattern 4B is formed on the upper surfaces of the base insulating layer 3 and the intermediate insulating layer 41 by an additive method, a subtractive method, or the like.

Figure 7G:
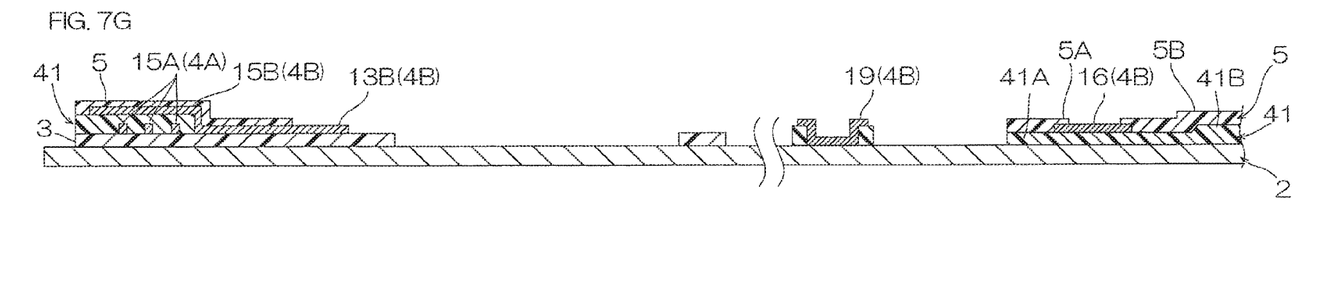

Next a varnish of a photosensitive resin is applied onto the base insulating layer 3 and the intermediate insulating layer 41 so as to cover the first conductor pattern 4A and the second conductor pattern 4B to be then dried. Thereafter, the obtained film is exposed to light and developed to be then cured by heating. At this time, the obtained film is not subjected to gradation exposure to light. That is by using a photomask having a pattern consisting of only the light shielding portion and the light fully transmitting portion, the light shielding portion faces the portion where the cover insulating layer 5 is not formed and the light fully transmitting portion faces the portion where the cover insulating layer 5 is formed to be then exposed to light.

In this manner, as shown in FIG. 7G, the cover insulating layer 5 is formed in the above-described pattern.

Thereafter, the metal, supporting board 2 is processed into the above-described outer shape.

In this manner, as shown in FIG. 5, the suspension board with circuit 40 is completed.

In the second embodiment, the same function and effect as that of the first embodiment can be obtained.

Another Embodiment

In the above-described second embodiment, in a portion that is overlapped with the piezoelectric element-connecting terminals 16, the base insulating layer 3 can be also provided between the intermediate insulating layer 41 and the metal supporting board 2.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit capable of being mounted with a piezoelectric element, comprising:
   a metal supporting board,
   a conductor layer having a terminal capable of being electrically connected to the piezoelectric element and disposed above the metal supporting board at spaced intervals thereto,
   a first insulating layer disposed between the metal supporting board and the conductor layer so as to support the conductor layer, and
   a second insulating layer disposed on the first insulating layer and the conductor layer so as to expose the terminal, wherein
   the first insulating layer includes
   a first portion including the terminal viewed from a thickness direction of the metal supporting board, and
   a second portion disposed in a position different from that of the first portion viewed from the thickness direction,
   the second insulating layer includes
   a third portion disposed on the first portion, and
   a fourth portion disposed on the second portion,
   the first portion is a recessed portion dented from an upper surface of the first insulating layer toward the metal supporting board,
   a thickness of the recessed portion is thinner than that of the second portion, and
   the third portion is dented from an upper surface of the second insulating layer toward the metal supporting board so as to fit the recessed portion.

2. The suspension board with circuit according to claim 1, wherein
   an area of the first portion is larger than that of the terminal viewed from the thickness direction.

3. The suspension board with circuit according to claim 2, wherein
   a thickness of the third portion is the same as that of the fourth portion.

4. A method for producing a suspension board with circuit according to claim 1 comprising the steps of:
   forming the first insulating layer on the metal supporting board,
   forming the conductor layer on the first insulating layer, and
   forming the second insulating layer on the first insulating layer and the conductor layer so as to expose the terminal, wherein
   the first portion and the second portion are formed in the first insulating layer by subjecting a varnish of a photosensitive resin applied in a uniform thickness to gradation exposure to light.

5. The suspension board with circuit according to claim 1, wherein the metal supporting board includes a supporting portion on which a slider is mounted,
   wherein the first insulating layer has an opening which exposes the supporting portion, and
   wherein the first portion is formed in an edge portion of the opening of the first insulating layer.

6. The suspension board with circuit according to claim 5, wherein the metal supporting board has an opening having a generally U-shape in plan view, and
   wherein the opening having a generally U-shape in plan view overlaps the opening of the first insulating layer.

* * * * *